United States Patent
Renkens et al.

(10) Patent No.: US 6,597,433 B1
(45) Date of Patent: Jul. 22, 2003

(54) MULTI-STAGE DRIVE ARRANGEMENTS AND THEIR APPLICATION IN LITHOGRAPHIC PROJECTION APPARATUSES

(75) Inventors: Michael J. M. Renkens, Geleen (NL); Adrianus G. Bouwer, Nuenen (NL); Johannes C. Driessen, Eindhoven (NL); Theodorus H. J. Bisschops, Eindhoven (NL); Hermanus M. J. R. Soemers, Mierlo (NL); Jakob Vijfvinkel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/551,232

(22) Filed: Apr. 17, 2000

(30) Foreign Application Priority Data

Apr. 19, 1999 (EP) .............................. 99201192

(51) Int. Cl.$^7$ ...................... G03B 27/62; G03B 27/58; G03B 27/42
(52) U.S. Cl. ................ 355/75; 355/53; 355/72
(58) Field of Search .................... 355/53, 72, 75; 356/399, 400, 401

(56) References Cited

U.S. PATENT DOCUMENTS

| 5,066,131 | A | | 11/1991 | Iwata et al. | |
|---|---|---|---|---|---|
| 5,850,280 | A | | 12/1998 | Ohtomo et al. | |
| 6,018,395 | A | * | 1/2000 | Mori et al. | 250/548 |
| 6,028,659 | A | * | 2/2000 | Kaneko | 355/53 |
| 6,172,739 | B1 | * | 1/2001 | Murata | 355/53 |
| 6,259,511 | B1 | * | 7/2001 | Makinouchi et al. | 355/53 |

FOREIGN PATENT DOCUMENTS

EP 0 634 700 A1 1/1995

* cited by examiner

Primary Examiner—Rodney Fuller
(74) Attorney, Agent, or Firm—Pillsbury Winthrop LLP (57) ABSTRACT

A lithographic apparatus for step-and-scan operation has a three stage structure for the wafer stage. During step-and-scan operation, the long-stroke stage is moved steadily along the row or column of dies to be exposed sequentially. An intermediate scanning stage moves in a figure-of-eight motion relative to the long-stroke stage so that the net movement of the fine stage, which is carried by the scanning stage, is a meander path.

16 Claims, 3 Drawing Sheets

MULTI-STAGE DRIVE ARRANGEMENTS AND THEIR APPLICATION IN LITHOGRAPHIC PROJECTION APPARATUSES

BACKGROUND OF THE INVENTION

1. Field of the Invention

The present invention relates to multi-stage drive arrangements for driving an object along a meandering path. More particularly, the invention relates to the application of such devices in lithographic projection apparatuses.

2. Discussion of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatuses, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatuses employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser plasma sources or synchrotron radiation from electron storage rings. An outline design of a lithographic projection apparatuses using synchrotron radiation is described in "Synchrotron radiation sources and condensers for projection x-ray lithography", JB Murphy et al, Applied Optics Vol. 32 No. 24 pp 6920–6929 (1993).

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated, and optical elements for EUV radiation can be spoiled, by the deposition of carbon layers on their surface, which imposes the additional requirement that hydrocarbon partial pressures should generally be kept below $10^{-8}$ or $10^{-9}$ millibar. Otherwise, for apparatuses using EUV radiation, the total vacuum pressure need only be $10^{-3}$ or $10^{-4}$ mbar, which would typically be considered a rough vacuum.

Further information with regard to the use of electron beams in lithography can be gleaned, for example, from U.S. Pat. No. 5,079,122 and U.S. Pat. No. 5,260,151, as well as from EP-A-0 965 888.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimise or eliminate contaminant and total outgassing, i.e both outgassing from the materials themselves and from gases adsorbed on their surfaces, should be used. It would be very desirable to be able to reduce or circumvent such restrictions.

SUMMARY OF THE INVENTION

It is an object of the present invention to provide a lithographic projection apparatus with an improved scanning stage arrangement that can easily drive a substrate stage along a meandering path, for example that required for step-and-scan or sub-field stitching operations.

According to the present invention, these and other objects are achieved in a lithographic projection apparatus that, has a radiation system for supplying a projection beam of radiation; a first object table provided with a first object holder for holding a mask, and provided with a first positioning component; a second object table provided with a second object holder for holding a substrate, and provided with a second positioning component; and a projection system for imaging an irradiated portion of the mask onto a target portion of the substrate. At least one of the first and second positioning components has a first stage having a first range of motion relative to a frame of reference; a second stage supported by the first stage and having a second range of motion relative to the first stage, the second range of motion being smaller than the first range of motion; and a third stage supported by the second stage and having a third range of motion, the third range of motion being smaller than the second range of motion, the third stage comprising a respective one of said object holders.

Current lithography apparatuses are designed for use in clean room environments and therefore some steps have conventionally been taken to reduce possible sources of contamination of wafers that are processed by the apparatus. However, conventional designs of wafer, mask and transfer stages are very complicated and employ large numbers of components for sensor and drive arrangements. Such stages also need to be provided with large numbers of signal and control cables and other utilities. The present invention, though usable in non-vacuum apparatus, has a particular advantage when used in vacuum as it avoids the difficult and detailed task of making such large numbers of components vacuum-compatible, or replacing them with vacuum-compatible equivalents, by adopting the principle of locating as many components and functions as possible outside the vacuum chamber. The present invention thus avoids the need to vacuum-proof many or most of the numerous components, by providing appropriate mechanical feedthroughs with innovative sealing arrangements. Likewise, the present invention avoids difficulties in reducing vibrations inevitable in vacuum apparatuses, particularly where powerful pumps are provided, by isolating as far as possible vibration sensitive components from the vacuum chamber wall.

In a preferred embodiment of the invention, at least the first and second ranges of movement are at least two-dimensional. During a step-and-scan operation the first, or long-stroke, stage moves steadily along the row or column of dies to be exposed whilst the second, or scanning, stage performs a figure-of-eight movement relative to the first stage. The sum of the two motions is a meander path. The third, or fine, stage performs positioning adjustments for increased accuracy.

The division of the long-stroke motion for step-and-scan motion between the first and second stages means that the first stage, which is most massive, need not undergo such frequent or large accelerations. The first stage can also act as a balance mass for the second and third stages.

Another aspect of the invention is a device manufacturing method that includes providing a substrate which is at least partially covered by a layer of energy-sensitive material; providing a mask containing a pattern; and using a projection beam of radiation to project an image of at least part of the mask pattern onto a target area of the layer of energy-sensitive material. During the step of projecting an image, at least one of the mask and substrate are mounted on an object table provided with an object holder for holding the mask or substrate, and provided with a positioning component; wherein the positioning component has a first stage having a first range of motion relative to a frame of reference; a second stage supported by the first stage and having a second range of motion relative to the first stage, the second range of motion being smaller than the first range of motion; and a third stage supported by the second stage and having a third range of motion, the third range of motion being smaller than the second range of motion, the third stage including the object holder.

BRIEF DESCRIPTION OF THE DRAWINGS

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which.

DETAILED DESCRIPTION OF THE PREFERRED EMBODIMENTS

In the various drawings, like parts are indicated by like references.

Embodiment 1

Figure 1:
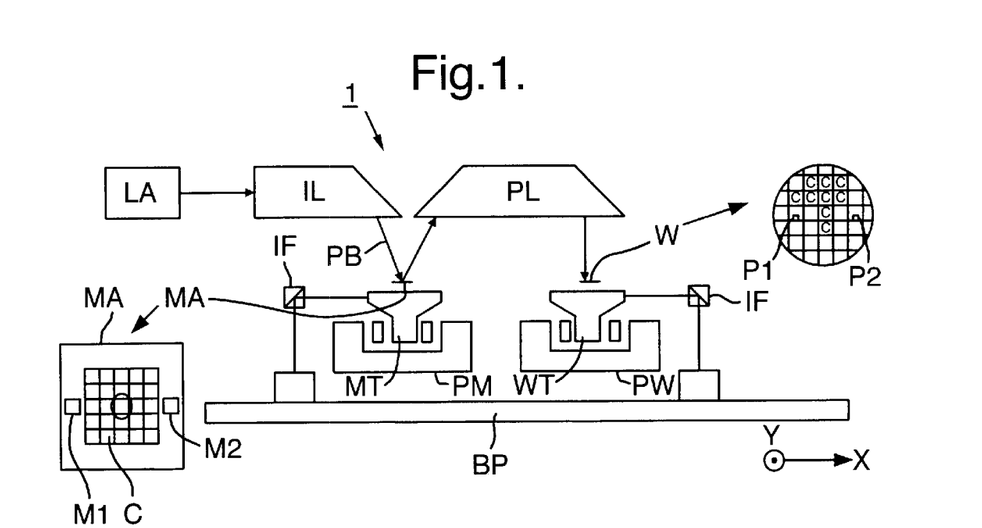
FIG. 1 depicts a lithographic projection apparatus according to a first embodiment of the invention.

FIG. 1 schematically depicts a lithographic projection apparatus 1 according to the invention. The apparatus comprises:
- a radiation system LA, IL for supplying a projection beam PB of radiation (e.g. UV or EUV radiation, electrons or ions);
- a first object table (mask table) MT provided with a mask holder for holding a mask MA (e.g. a reticle), and connected to a first positioning component PM for accurately positioning the mask with respect to item PL;

a second object table (substrate table) WT provided with a substrate holder for holding a substrate W (e.g. a resist-coated silicon wafer), and connected to a second positioning component PW for accurately positioning the substrate with a respect to item PL;

a projection system ("lens") PL (e.g. a refractive or catadioptric system, a mirror group or an array of field deflectors) for imaging an irradiated portion of the mask MA onto a target portion C (die) of the substrate W.

The radiation system comprises a source LA which produces a beam of radiation (e.g. an undulator or wiggler provided around the path of an electron beam in a storage ring or synchrotron, a plasma source, an electron or ion beam source, a mercury lamp or a laser). This beam is passed along various optical components included in illumination system IL, e.g. for the purpose of shaping and/or collimating the resultant beam PB, and/or making it uniformly intense throughout its cross-section.

The beam PB subsequently impinges upon the mask MA which is held in a mask holder on a mask table MT. Having been selectively reflected (or transmitted) by the mask MA, the beam PB passes through the "lens" PL, which focuses the beam PB onto a target area C of the substrate W. With the aid of the positioning component PW and interferometric displacement measuring device IF, the substrate table WT can be moved accurately, e.g. so as to position different target areas C in the path of the beam PB. Similarly, the positioning component PM and interferometric displacement measuring device IF can be used to accurately position the mask MA with respect to the path of the beam PB, e.g. after mechanical retrieval of the mask MA from a mask library or during a scanning motion. In the prior art, movement of the object tables MT, WT is generally realised with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT is simultaneously moved in the same or opposite direction at a speed V=Mv, in which M is the magnification of the lens PL (e.g., M=¼ or ⅕). In this manner, a relatively large target area C can be exposed, without having to compromise on resolution.

Principle of the Invention

Figure 2:
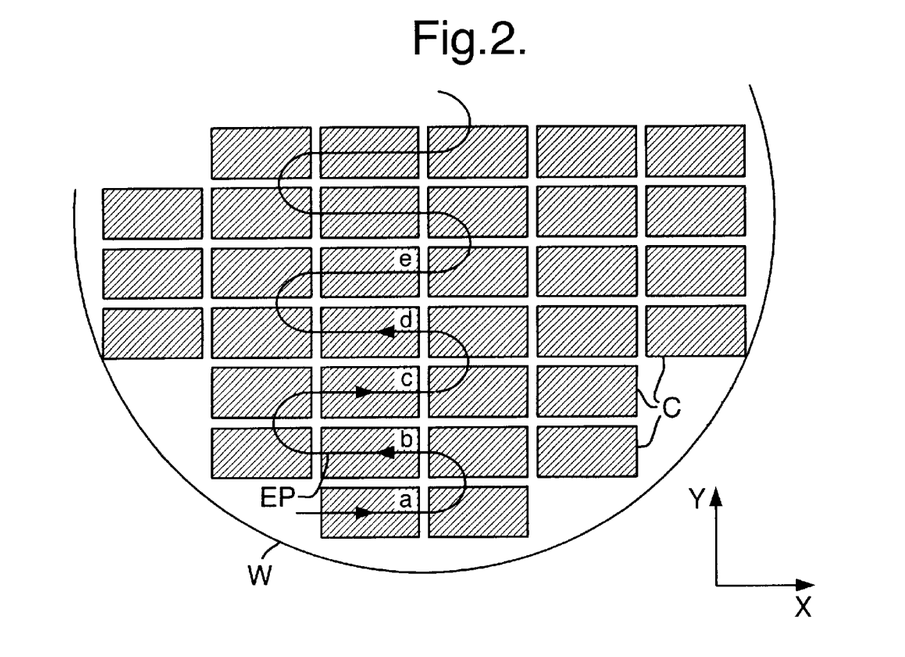
FIG. 2 is a plan view of a wafer showing the meandering exposure path for step-and-scan operation.

In the step-and-scan mode of the lithography apparatus of the present invention, the wafer stage moves along a meandering path underneath the projection lens PL to expose multiple dies C on the wafer W. FIG. 2 shows the effective path EP of the exposure point on the wafer W as dies a, b, c, d, e are exposed in turn. The actual exposure of each die takes place during the horizontal part of each meander, when the wafer is moving only in the X-direction. This part of the movement is called the scan motion and requires the highest accuracy of acceleration, speed and position of the stage. It should be noted that this meander pattern is adopted to improve overall throughput of the apparatus. As mentioned above, when a die is scanned, the reticle moves in parallel, or anti-parallel, with the motion of the wafer. Thus if dies in a line parallel to the scanning direction are exposed one after another, the reticle would need to be reset in the same direction between exposures of dies. The meander pattern allows the return motion of the reticle to be used to expose another die, thus increasing throughput. The present invention is also applicable to "stitched" exposure apparatus in which the mask pattern is divided into a plurality of subfields, for example strutted masks. In this case, each stroke of the meander pattern is used to expose one subfield, rather than one die.

Figure 3:
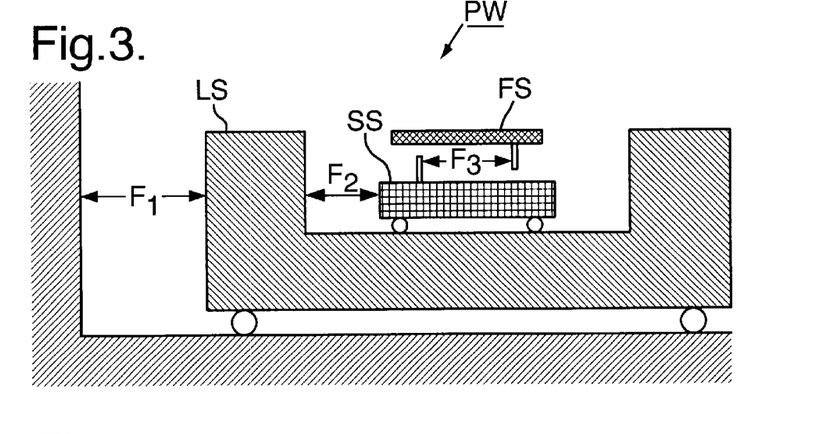
FIG. 3 is a view explaining the principle of the stage arrangement of the present invention.
Figure 4:
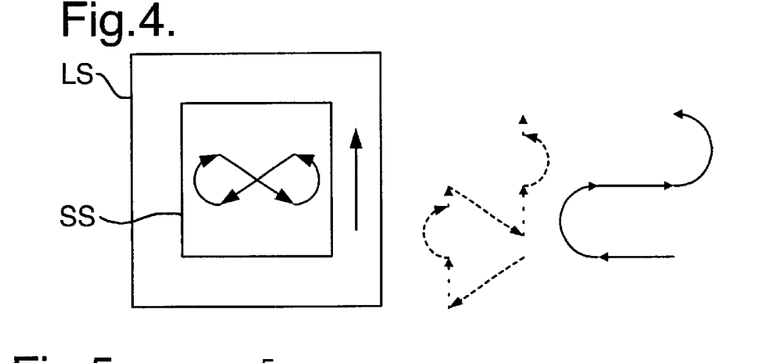
FIG. 4 is a view explaining the relative motions of the long-stroke and scanning stroke stages according to the principle of the present invention.

According to the present invention, the "long-stroke" meander motion is divided into two components: a steady progression along the length of the column of dies to be exposed (i.e. in the Y-direction) and a figure-of-eight motion across this steady progression. As shown in FIG. 3, the wafer positioning component PW is divided into three components: a long-stroke stage LS, an intermediate or scanning stage SS and a fine stage FS. During step-and-scan exposures, the long-stroke stage LS moves continuously along the column of dies to be exposed (Y-direction), effecting the steady progression, whilst the scanning stage SS is moved in the figure-of-eight motion relative to the long-stroke stage LS. FIG. 4 illustrates how these two motions combine to effect the desired meander motion. The fine stage FS is moved relative to the scanning stage SS as necessary, to effect any fine positional adjustments.

The long-stroke stage LS must have a range of motion sufficient to allow all dies on the wafer to be positioned under the projection optics PL for exposure. For a 300 mm wafer this can be achieved, for example, by a 400×400 Mm$^2$ motion, but will be larger for larger wafers. The accuracy of positioning of this stage need only be of the order of 1 mm, for example; more precise positioning can be effected by the fine stage FS. An acceptable rate of throughput can be achieved if the maximum acceleration of the long-stroke stage LS is 0.15 m/s$^2$ or less, and a jerk of 1 m/s$^3$ or less.

The range of motion of the scanning stage SS must accommodate the intended die size, both in width and length. A die of 52×26 mm$^2$ can be accommodated if the scanning stage SS has a range of motion of about 75×40 mm$^2$, for example. The positional accuracy of the scanning stage is preferably of the order of about 1 $\mu$m. Typically, the maximum acceleration of the scanning stage SS is about 4 m/s$^2$ and the jerk is about 250 m/s$^3$, which can easily be achieved given the relatively low mass of the scanning and fine stages.

The range of motion of the fine stage is comparable to current designs and may be of order about 1×1×1 mm$^3$, for example. Its accuracy of course is much higher, and will be sufficient to meet the net repositioning and repeatability requirements of the apparatus.

The three-stage arrangement of the present invention also provides advantages during the alignment procedure that is carried out prior to exposure. During this procedure the stage must move between alignment points that are distributed within the total motion range. The alignment procedure is an overhead that has a detrimental effect on throughput, and so must be accomplished in as short a time as possible. This necessitates the long-stroke stage being moved at relatively high speeds between the alignment points. With the invention, the "play" between the long-stroke stage and the scanning stage can be utilised to limit the acceleration of the long-stroke stage during such motions. If the full amount of the play between long-stroke and scanning stages is traversed during a movement between alignment points, a substantial reduction in the acceleration of the long-stroke stage can be achieved without compromising the speed of the alignment process. The reduction in the acceleration leads to advantages in reducing the size and frequency of reaction forces and the size and power of the necessary motors.

The three-stage arrangement of the present invention also provides advantages in balancing arrangements. Since the relative motions between the scanning stage and the fine stage are very small, of order of a few microns or tens of microns, the two stages can be treated as a single mass for kinematic purposes. The mass of the long-stroke stage is considerably larger than the combined masses of the scanning and fine stages and so the long-stroke stage acts as balance mass for the scanning and fine stages. Reaction motions of the long-stroke stage are discounted in its set point profile to prevent these motions being transferred to the frame by the servo stiffness of the long-stroke stage.

Practical embodiments of the principles of the invention are described below.

Embodiment 2

Figure 5:
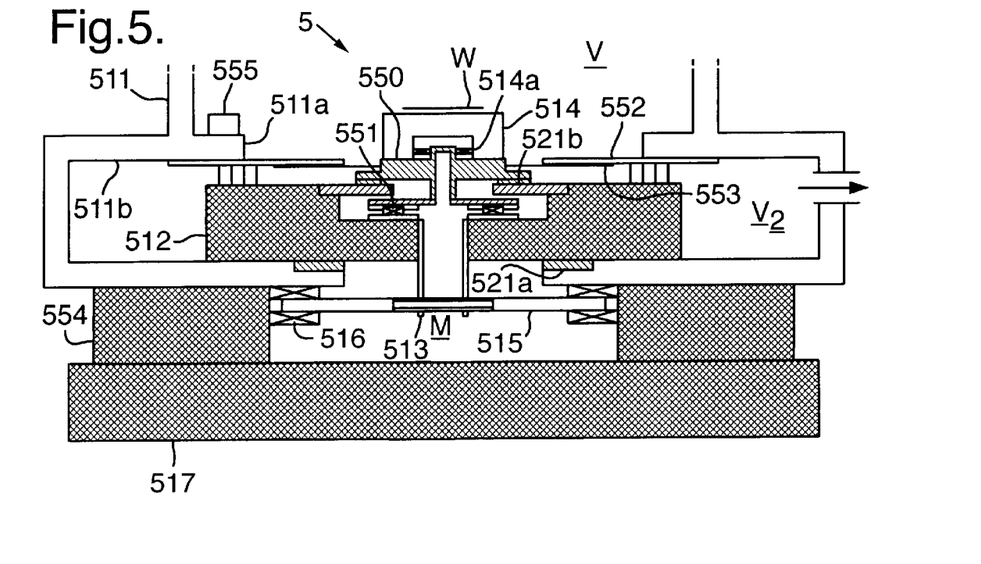
FIG. 5 is a cross-sectional view of a wafer stage of a lithographic projection apparatus according to a second embodiment of the invention.

A second embodiment of the invention, comprising lithographic apparatus 5, is shown schematically in FIG. 5. This embodiment additionally incorporates a motion feed-through concept that is further described in European Patent Application No. 99201220.3 entitled "Motion Feed-Through into a Vacuum Chamber and its Application in Lithographic Apparatus" and a concurrently filed U.S. application of the same title (Applicant's ref P-0130.010) which are incorporated herein by reference. This second embodiment of the invention is particularly adapted for step-and-scan operation.

Lithographic apparatus 5 includes a long-stroke sliding seal plate 512 which is accommodated in second vacuum chamber $V_2$. Fine stage 514 is accommodated in the primary vacuum chamber V and provides fine positioning for the wafer W using drivers 514a. Between these two stages an intermediate or scanning stage 550 is provided. In step-and-scan operation of this embodiment, the long-stroke sliding seal plate 512 is driven at a constant speed along the length of a row or column of dies that are to be exposed. The scanning stage 550 is then driven relative to the long-stroke sliding seal plate 512 in a figure-of-eight motion so that the net motion of the wafer underneath the exposure point is a meander appropriate for the step-and-scan operation. This arrangement reduces the acceleration forces that need be exerted on the substantial mass of the long-stroke sliding seal plate 512.

The main vacuum chamber V can be kept at a pressure in the range of from $10^{-7}$ to $10^{-8}$ mbar and the second vacuum chamber $V_2$ at a pressure of the order of $10^{-5}$ to $10^{-6}$ mbar. To enable these vacuum levels to be achieved, the long-stroke stage plate 512 is supported by differentially pumped gas bearings 521a which are described further in European Patent Application No. 99201193.2 entitled "Gas-Bearings for use in Vacuum Chambers and their Application in Lithographic Apparatus" as well as a concurrently filed U.S. application of similar title (Applicant's ref: P-0133.010) which are incorporated herein by reference. The differentially pumped air bearings maintain a constant gap in the range of from 5 to 10 $\mu$m, for example. The scanning stage 550 is also supported by similar gas bearings 521b.

The secondary vacuum chamber $V_2$ is isolated from the primary vacuum chamber V by a sliding seal arrangement formed by upper sliding seal plate 552 mounted on the long-stroke sliding seal plate 512 and lower sliding seal plate 553 mounted on the scanning stage 550. The upper sliding seal plate 552 is generally square with a central aperture large enough to accommodate the scanning stage 550 and its range of movement relative to the long-stroke stage. The upper sliding seal plate is somewhat larger than the aperture 511a in the vacuum chamber wall 511, so that, whatever the position of the long-stroke stage, a wide portion of the upper sliding seal plate 552 opposes directly the lower surface 511b of the vacuum chamber wall 511. The lower sliding seal plate 553 is also square, with a central aperture that is filled by the scanning stage 550. The lower sliding seal plate 553 is likewise somewhat larger than the aperture in the upper sliding seal plate 552 so that, whatever the position of the scanning stage relative to the long-stroke stage, a wide portion of the entire periphery of the lower sliding seal plate 553 opposes directly the bottom surface of the upper sliding seal plate 552. Because the forces exerted by the pressure differential between the primary and secondary vacuum stages are negligible and the upper and lower sliding seal plates are not load bearing, there is no need for an air bearing between them or between the upper sliding seal plate and the vacuum chamber wall 511. Instead, the gaps between the two plates and between the upper plate and the vacuum chamber wall are made to be about 500 $\mu$m or less, and the overlap is made wide enough to reduce leakage to acceptable levels. The various sealing plates and apertures may also be circular.

The long-stroke stage plate 512 may be driven by an H-drive arrangement including linear motors 516 which move transverse beam 515 laterally to provide, e.g., Y and $\phi_z$, movement, and a further linear motor (not shown) mounted longitudinally on the transverse beam 515 which acts on pillar 513 to provide movement, e.g., in the X direction. The motor chamber M which accommodates the long-stroke drive is kept at below, e.g., 0.1 mbar, but this chamber is isolated from the main vacuum chamber V so that the long-stroke drive arrangements need not be high-vacuum compatible. An appropriate preload to the long-stroke stage plate bearing 521a is provided by the net force on the plate resulting from the pressure load over the aperture area and the weight of the long-stroke stage plate 512. The drive of the long-stroke stage acts against the base 517 via mounts 554. Because the long-stroke stage moves at a substantially constant speed the need for a balance mass can be avoided. The drive 551 for scanning stage 550 may be an arrangement of linear motors acting via thrust air bearings on beams. The relatively large mass of the long-stroke stage, mostly the long-stroke sliding seal plate 512, acts as a balance mass for the scanning stage 550.

Cabling and supply lines (not shown) to the scanning stage 550 and fine stage 514 can be routed through the motor compartment M and the interior of hollow pillar 513. The position of the fine stage 514 can be monitored via position sensing device 555, which may be of the interferometer type.

Embodiment 3

Figure 6:
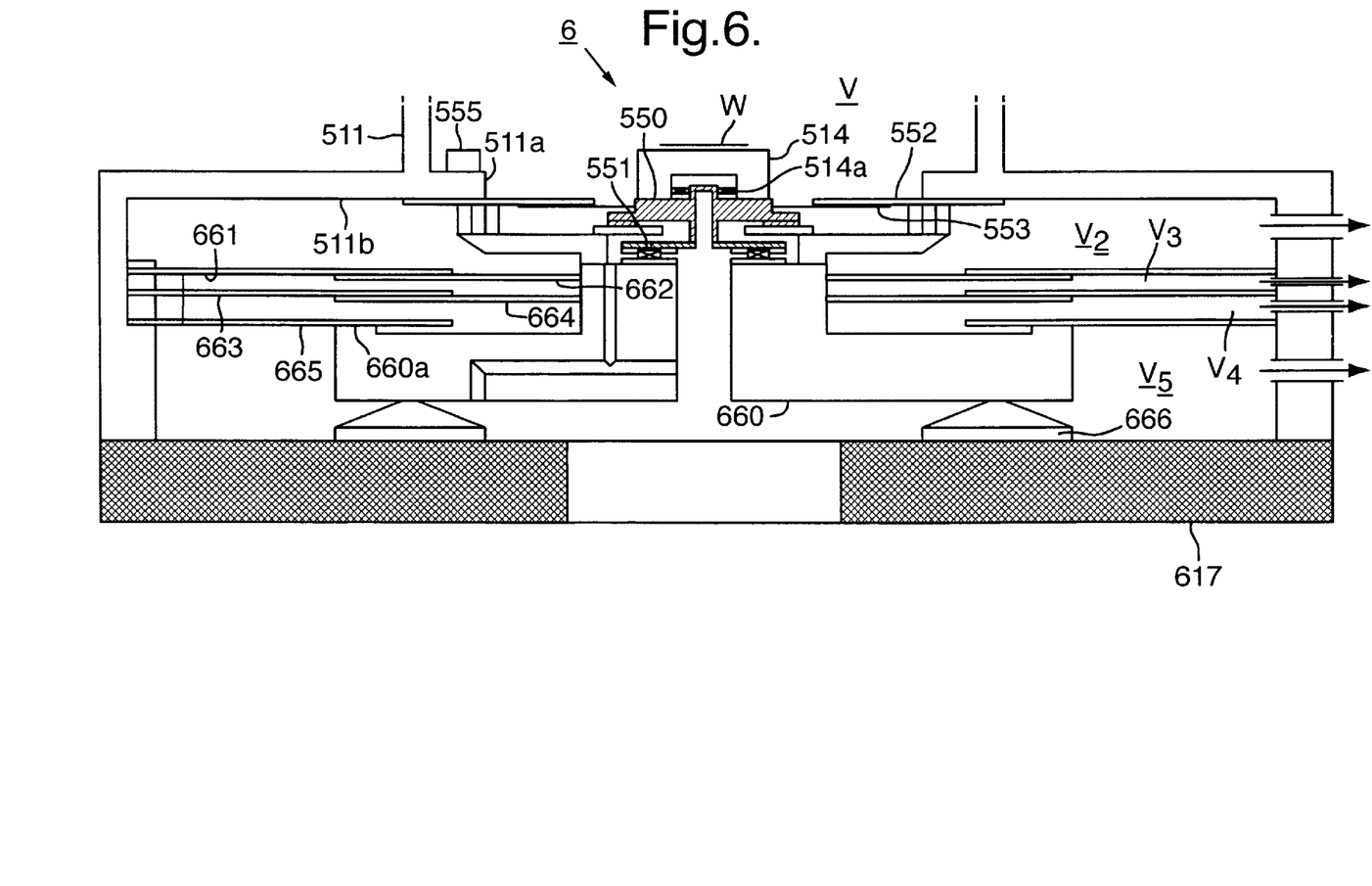
FIG. 6 is a cross-sectional view of a wafer stage of a lithographic projection apparatus according to a third embodiment of the invention.

A lithographic apparatus 6 according to a third embodiment of the invention is shown schematically in FIG. 6. The third embodiment is a variation of the second embodiment and shares a number of parts in the fine and scanning stages in common, mostly indicated by like reference numerals. A description of the common parts is omitted for the sake of brevity.

In this third embodiment the primary vacuum chamber V is sealed by a labyrinth sliding seal arrangement forming intermediate vacuum chambers $V_2$ to $V_5$ which are separately pumped to decreasing vacuum levels by respective vacuum pumps (not shown). As before, the primary vacuum chamber can be maintained in use at a vacuum level of about $10^{-7}$ to $10^{-8}$ mbar, whilst the intermediate vacuum chambers are maintained at levels as follows, for example:

| | |
|---|---|
| $V_2$ | $2.5 \times 10^{-6}$ mbar |
| $V_3$ | $5 \times 10^{-4}$ mbar |
| $V_4$ | 0.1 mbar |
| $V_5$ | 1 mbar. |

The labyrinth sliding seal comprises first to fifth sliding seal plates 661 to 665 together with sealing surface 660a provided on the upper surface of the long-stroke stage plate 660. In other embodiments fewer stages may suffice. The first, third and fifth sliding seal plates, 661, 663 and 665, project inwardly from the vacuum chamber wall, and each has a central aperture large enough to accommodate the range of movement of the long-stroke stage plate 660, as well as the cross-section of the long-stroke stage plate at that level. The second and fourth sliding seal plates 662, 664 project outwardly from the long-stroke stage, and have an outer perimeter large enough that, whatever the position of the long-stroke stage plate throughout its normal range of movement, there is an overlap with the odd-numbered sliding seal plates. Similarly, the sealing surface 660a on the long-stroke stage plate 660 is arranged at a position so that it directly opposes the fifth sliding seal plate 665 at all positions of the long-stroke stage plate.

The first and second sliding seal plates 661, 662 together isolate the first intermediate vacuum chamber $V_2$ from the second $V_3$, the third and fourth sliding seal plates 663, 664 isolate the second intermediate vacuum chamber $V_3$ from the third $V_4$ and the fifth sliding seal plate 665 and sealing surface 660a isolate the third intermediate vacuum chamber $V_4$ from the fourth $V_5$. In each case, the gap between the opposed plates and the extent of the overlap is chosen to ensure that leakage from the chamber of higher pressure into the chamber of lower pressure is limited to a level that the respective vacuum pumps can tolerate. The gaps between first and second and between third and fourth sliding seal plates may be of order 500 $\mu$m, whilst the gap between the fifth sliding seal plate 665 and the sealing surface 660a may be of order 100 $\mu$m.

In the third embodiment the long-stroke stage plate 660 is supported over the base 617 by (conventional) air bearings provided in feet 666. The drive arrangements (not shown) can be the same as those of the second embodiment.

The invention is described above in relation to preferred embodiments; however it will be appreciated that the invention is not limited by the above description. In particular, the invention has been described above in relation to the wafer stage of a lithographic apparatus that is accommodated in a vacuum chamber. However, it will readily be appreciated that the present invention is equally applicable to mask stages and to lithography apparatus not in vacuum.

What is claimed is:

1. A lithographic projection apparatus, comprising:
   a radiation system constructed to supply a projection beam of radiation;
   a first object table provided with a first object holder for holding a mask, and provided with a first positioning component;
   a second object table provided with a second object holder for holding a substrate, and provided with a second positioning component; and
   a projection system constructed and arranged to image a portion of the mask onto a target portion of the substrate,
   wherein at least one of said first and second positioning components comprises:
      a first stage having a first range of motion relative to a frame of reference;
      a second stage supported by said first stage and having a second range of motion relative to said first stage, said second range of motion being smaller than said first range of motion; and
      a third stage supported by said second stage and having a third range of motion, said third range of motion being smaller than said second range of motion, said third stage supporting a respective one of said object holders.

2. Apparatus according to claim 1 wherein said first range of motion is larger than the maximum size of mask or substrate that can be accommodated by said object holder.

3. An apparatus according to claim 1, wherein said second range of motion is larger than said portion of said mask or said target portion of said wafer.

4. An apparatus according to claim 1, wherein said second range of motion is smaller than four times a size of said portion of said mask or said target portion of said wafer.

5. An apparatus according to claim 1, wherein said third range of motion is larger than a combined nominal positional accuracy of the first and second stages.

6. An apparatus according to claim 1, wherein at least one of said first and second ranges of motion is two dimensional.

7. An apparatus according to claim 1, wherein both of said first and second ranges of motion are two dimensional.

8. An apparatus according to claim 1, further comprising a first drive unit constructed and arranged to drive said first stage throughout said first range of motion and a second drive unit constructed and arranged to drive said second stage throughout said second range of motion, said second drive unit acting against said first stage to drive said second stage.

9. An apparatus according to claim 1, further comprising a stage controller, operative during a step-and-scan operation of said apparatus, constructed and arranged to control said first stage to follow a steady linear motion along a line of a series of portions to be exposed sequentially, and for controlling said second stage to follow a figure-of-eight path relative to said first stage concurrently with said steady linear motion, whereby movement of said third stage relative to said frame of reference follows a meandering path.

10. An apparatus according to claim 1, further comprising a controller, operative during an alignment process of said apparatus, constructed and arranged to control said first and second stages to move said third stage from a first position to a second position, said controller being adapted to operate such that said second stage is set at or near a first extreme of the second range of motion when said third stage is at said first position and is set at or near a second extreme when said third stage is at said second position, said first and second extremes being mutually opposite relative to the direction of motion of said third stage between said first and second positions.

11. A device manufacturing method, comprising:
generating a beam of illumination radiation;
disposing a substrate which is at least partially covered by a layer of energy-sensitive material in at least a portion of said beam of illumination radiation;
disposing a mask containing a pattern in at least a portion of said beam of illumination radiation;
projecting an image of at least part of the mask pattern onto a target area of the layer of energy-sensitive material using said beam of illumination radiation,
wherein at least one of said mask and said substrate in said projecting step are held on an object table provided with an object holder and positioned with a positioning assembly;
wherein said positioning assembly comprises:
a first stage having a first range of motion relative to a frame of reference;
a second stage supported by said first stage and having a second range of motion relative to said first stage, said second range of motion being smaller than said first range of motion; and
a third stage supported by said second stage and having a third range of motion, said third range of motion being smaller than said second range of motion, said third stage supporting said object holder.

12. A device manufactured in accordance with the method of claim 11.

13. A lithographic projection apparatus, comprising:
a radiation system constructed to supply a projection beam of radiation;
a first object table provided with a first object holder for holding a mask, and provided with a first positioning component;
a second object table provided with a second object holder for holding a substrate, and provided with a second positioning component;
a projection system constructed and arranged to image a portion of the mask onto a target portion of the substrate,
wherein at least one of said first and second positioning components comprises:
a first stage having a first range of motion relative to a frame of reference;
a second stage supported by said first stage and having a second range of motion relative to said first stage, said second range of motion being smaller than said first range of motion;
a third stage supported by said second stage and having a third range of motion, said third range of motion being smaller than said second range of motion, said third stage supporting a respective one of said object holders;
a first drive unit constructed and arranged to drive said first stage throughout said first range of motion and a second drive unit constructed and arranged to drive said second stage throughout said second range of motion, said second drive unit acting against said first stage to drive said second stage; and
a stage controller, operative during a step-and-scan operation of said apparatus, constructed and arranged to control said first stage to follow a steady linear motion along a line of a series of portions to be exposed sequentially, and for controlling said second stage to follow a figure-of-eight path relative to said first stage concurrently with said steady linear motion, whereby movement of said third stage relative to said frame of reference follows a meandering path.

14. A lithographic projection apparatus, comprising:
a radiation system constructed to supply a projection beam of radiation;
a first object table provided with a first object holder for holding a mask, and provided with a first positioning component;
a second object table provided with a second object holder for holding a substrate, and provided with a second positioning component;
a projection system constructed and arranged to image a portion of the mask onto a target portion of the substrate,
wherein at least one of said first and second positioning components comprises:
a first stage having a first range of motion relative to a frame of reference;
a second stage supported by said first stage and having a second range of motion relative to said first stage, said second range of motion being smaller than said first range of motion;
a third stage supported by said second stage and having a third range of motion, said third range of motion being smaller than said second range of motion, said third stage supporting a respective one of said object holders;
a first drive unit constructed and arranged to drive said first stage throughout said first range of motion and a second drive unit constructed and arranged to drive said second stage throughout said second range of motion, said second drive unit acting against said first stage to drive said second stage; and
a drive unit controller, operative during an alignment process of said apparatus, constructed and arranged to control said first and second drive units to move said third stage from a first position to a second position, said drive unit controller being adapted to operate such that said second stage is set at or near a first extreme of the second range of motion when said third stage is at said first position and is set at or near a second extreme when said third stage is at said second position, said first and second extremes being mutually opposite relative to the direction of motion of said third stage between said first and second positions.

15. A device manufacturing method, comprising:
generating a beam of illumination radiation;
disposing a substrate which is at least partially covered by a layer of energy-sensitive material in at least a portion of said beam of illumination radiation;
disposing a mask containing a pattern in at least a portion of said beam of illumination radiation;
projecting an image of at least part of the mask pattern onto a target area of the layer of energy-sensitive material using said beam of illumination radiation,
wherein at least one of said mask and said substrate in said projecting step are held on an object table provided with an object holder and positioned with a positioning assembly;

wherein said positioning assembly comprises:
- a first stage having a first range of motion relative to a frame of reference; a second stage supported by said first stage and having a second range of motion relative to said first stage, said second range of motion being smaller than said first range of motion;
- a third stage supported by said second stage and having a third range of motion, said third range of motion being smaller than said second range of motion, said third stage supporting said object holder; and
- wherein said projecting is carried out in a step-and-scan manner and, during said projecting, said first stage is controlled to follow a steady linear motion along a line of a series of portions to be exposed sequentially and said second stage is controlled to follow a figure-of-eight path relative to said first stage concurrently with said steady linear motion, whereby movement of said third stage relative to said frame of reference follows a meandering path.

16. A device manufacturing method, comprising:

generating a beam of illumination radiation;

disposing a substrate which is at least partially covered by a layer of energy-sensitive material in at least a portion of said beam of illumination radiation;

disposing a mask containing a pattern in at least a portion of said beam of illumination radiation;

projecting an image of at least part of the mask pattern onto a target area of the layer of energy-sensitive material using said beam of illumination radiation, wherein at least one of said mask and said substrate in said projecting step are held on an object table provided with an object holder and positioned with a positioning assembly;

wherein said positioning assembly comprises:
- a first stage having a first range of motion relative to a frame of reference; a second stage supported by said first stage and having a second range of motion relative to said first stage, said second range of motion being smaller than said first range of motion;
- a third stage supported by said second stage and having a third range of motion, said third range of motion being smaller than said second range of motion, said third stage supporting said object holder; and
- aligning at least one of the mask and the substrate prior to said projecting, and wherein, during the aligning, said third stage is moved from a first position to a second position such that said second stage is set at or near a first extreme of the second range of motion when said third stage is at said first position and is set at or near a second extreme when said third stage is at said second position, said first and second extremes being mutually opposite relative to the direction of motion of said third stage between said first and second positions.

* * * * *